(12) United States Patent
Allred et al.

(10) Patent No.: US 7,092,537 B1
(45) Date of Patent: Aug. 15, 2006

(54) DIGITAL SELF-ADAPTING GRAPHIC EQUALIZER AND METHOD

(75) Inventors: Rustin W. Allred, Plano, TX (US); Hirohisa Yamaguchi, Ibaraki (JP); Yoshito Higa, Ibaraki (JP)

(73) Assignee: Texas Instruments Incorporated, Dallas, TX (US)

( * ) Notice: Subject to any disclaimer, the term of this patent is extended or adjusted under 35 U.S.C. 154(b) by 1134 days.

(21) Appl. No.: 09/672,253

(22) Filed: Sep. 28, 2000

Related U.S. Application Data

(60) Provisional application No. 60/169,519, filed on Dec. 7, 1999.

(51) Int. Cl.
*H03G 5/00* (2006.01)

(52) U.S. Cl. ............... 381/103; 381/94.2; 381/94.3
(58) Field of Classification Search ............. 381/103, 381/83, 93, 98, 94.2, 94.3; 333/28 R
See application file for complete search history.

(56) References Cited

U.S. PATENT DOCUMENTS 4,340,780 A * 7/1982 Odlen ............... 381/103
4,610,024 A * 9/1986 Schulhof ............... 381/103

* cited by examiner

*Primary Examiner*—Melur Ramakrishnaiah
(74) *Attorney, Agent, or Firm*—W. James Brady; Frederick J. Telecky, Jr.

(57) ABSTRACT

A self-adaptive graphic equalizer operable to equalize the affects of an audio system on an audio signal includes an adaptive graphic equalizer having a plurality of equalizing filters, where the plurality of equalizing filters have different center frequencies equidistant from one another and spanning a predetermined audio bandwidth. Each equalizing filter is operable to filter an $i^{th}$ sub-band of the audio signal. A plurality of first filters are coupled to the audio system, each first filter is operable to filter an $i^{th}$ sub-band of an output signal of the audio system. A plurality of second filters are operable to filter an $i^{th}$ sub-band of the audio signal. A gain adjuster is operable to adjust the $i^{th}$ sub-band of the adaptive graphic equalizer in response to a difference in the $i^{th}$ sub-band of the filtered output signal from the plurality of first filters and the $i^{th}$ sub-band of the filtered audio signal from the plurality of second filters.

22 Claims, 3 Drawing Sheets

DIGITAL SELF-ADAPTING GRAPHIC EQUALIZER AND METHOD

RELATED PATENT APPLICATION

This application claims priority under 35 USC Å119(e)(1) of provisional application No. 60/169,519 filed Dec. 7, 1999.

This application is related to co-pending U.S. Ser. No. 09/401,422, entitled digital graphic equalizer control system and method, filed on Sep. 22. 1999.

TECHNICAL OF THE INVENTION

This invention is related in general to the field of digital signal processing. More particularly, the invention is related to digital self-adapting graphic equalizer and method.

BACKGROUND OF THE INVENTION

The acoustic sound generated by conventional speakers contains a large degree of distortion due to the physical limitations of the mechanical structure of the speakers. For purposes of this document, "distortion" is used to mean sound pressure level variation as a function of frequency. Therefore, even with high quality audio processing and digital recording, the actual acoustic sound waves reproduced by conventional speakers are typically far from an accurate reproduction of the original sound. In low end to mid-range electronic consumer products, the distortion due to the speaker system is even more pronounced.

Self-adapting speaker equalization systems are presently costly to implement. These conventional self-adapting speaker equalization systems are therefore unsuitable to low end to mid-range electronic consumer products, such as lap-top computers and desktop computers. However, the demand for high quality sound in these systems is unprecedented due to the proliferation of multimedia applications, digital music download and playback, and world wide web multimedia websites.

SUMMARY OF THE INVENTION

Accordingly, there is a need for digital self-adaptive graphic equalizer system and method which produces good sound quality and are not costly to realize and implement as conventional systems.

In one aspect of the invention, a self-adaptive graphic equalizer is operable to equalize the affects of an audio system on an audio signal. The self-adaptive graphic equalizer includes an adaptive graphic equalizer having a plurality of equalizing filters, where the plurality of equalizing filters have different center frequencies equidistant from one another and spanning a predetermined audio bandwidth. Each equalizing filter is operable to filter an $i^{th}$ sub-band of the audio signal. A plurality of first filters are coupled to the audio system, each first filter is operable to filter an $i^{th}$ sub-band of an output signal of the audio system. A plurality of second filters are operable to filter an $i^{th}$ sub-band of the audio signal. A gain adjuster is operable to adjust the $i^{th}$ sub-band of the adaptive graphic equalizer in response to a difference in the $i^{th}$ sub-band of the filtered output signal from the plurality of first filters and the $i^{th}$ sub-band of the filtered audio signal from the plurality of second filters.

In another aspect of the invention, a digital self-adaptive graphic equalization method that equalizes the affects of a speaker-microphone system and the environment on an audio signal includes the steps of receiving an output signal from the audio system, the output signal being generated by the audio system in response to the audio signal. The output signal is divided into N sub-bands and an $i^{th}$ sub-band of the output signal is filtered, where i=1–N. The audio signal is also divided into the same N sub-bands and the $i^{th}$ sub-band of the audio signal is filtered, where i=1–N. A difference between the $i^{th}$ filtered sub-band of the audio signal and the $i^{th}$ filtered sub-band of the output signal is determined, and the gain of an $i^{th}$ equalizing filter of an adaptive graphic equalizer is adjusted in response the difference between the $i^{th}$ filtered sub-band of the audio and output signals. The equalizing filters have different center frequencies equidistant from one another and spanning a predetermined audio bandwidth. An equalized audio signal is generated and provided to the audio system.

In yet another aspect of the invention, a digital self-adaptive graphic equalization method that equalizes the affects of a speaker-microphone system and the environment on an audio signal includes the steps of receiving an output signal from the audio system, the output signal being generated by the audio system in response to the audio signal. The output signal is divided into N sub-bands and an $i^{th}$ sub-band of the output signal is filtered, where i=1–N. The audio signal is also divided into the same N sub-bands and the $i^{th}$ sub-band of the audio signal is filtered, where i=1–N. The method time averages the N sub-bands of the filtered, output signal, time averages the N sub-bands of the filtered audio signal, and normalizes the time averaged N sub-bands of the filtered output signal and the time averaged N sub-bands of the filtered audio signal. A difference between the $i^{th}$ filtered sub-band of the audio signal and the $i^{th}$ filtered sub-band of the output signal is determined, and the gain of an $i^{th}$ equalizing filter of an adaptive graphic equalizer is adjusted in response the difference between the $i^{th}$ filtered sub-band of the audio and output signals. The equalizing filters have different center frequencies equidistant from one another and spanning a predetermined audio bandwidth. An equalized audio signal is generated and provided to the audio system.

BRIEF DESCRIPTION OF THE DRAWINGS

For a better understanding of the present invention, reference may be made to the accompanying drawings, in which.

DETAILED DESCRIPTION OF THE INVENTION

Figure 1:
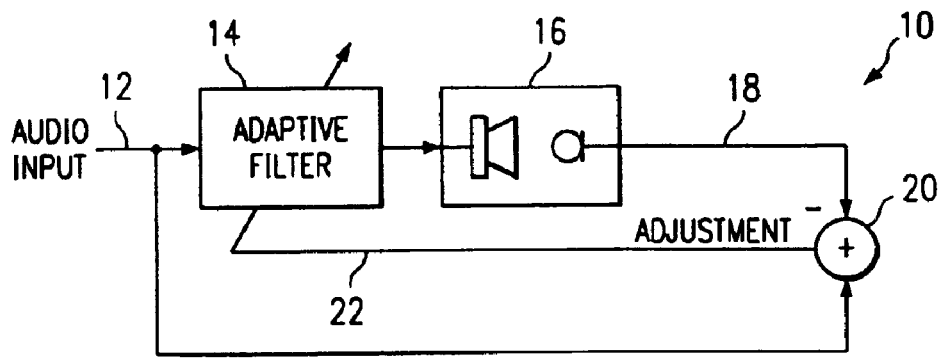
FIG. 1 is a simplified block diagram of a conventional adaptive equalizer.

FIG. 1 is a simplified block diagram of a conventional adaptive equalizer 10. Digital self-adaptive graphic equalizer 10 receives an audio input signal 12, which is processed by an adaptive filter 14. The output from adaptive filter 14 is supplied to a speaker-microphone combination block 16. Speaker-microphone combination block 16 reproduces the audio signal processed by adaptive filter 14 and the acoustical sound output is measured by the microphone and provided as an acoustic input 18 to a summer 20. Summer 20 determines the difference between audio input 12 and acoustic input 18 and provides an adjustment input 22 to adaptive filter 14. Adjustment input 22 is used to adjust adaptive filter 14 to remove distortion introduced by the speaker, so that the difference between audio input signal 12 and the output from the speaker is minimized.

Figure 2:
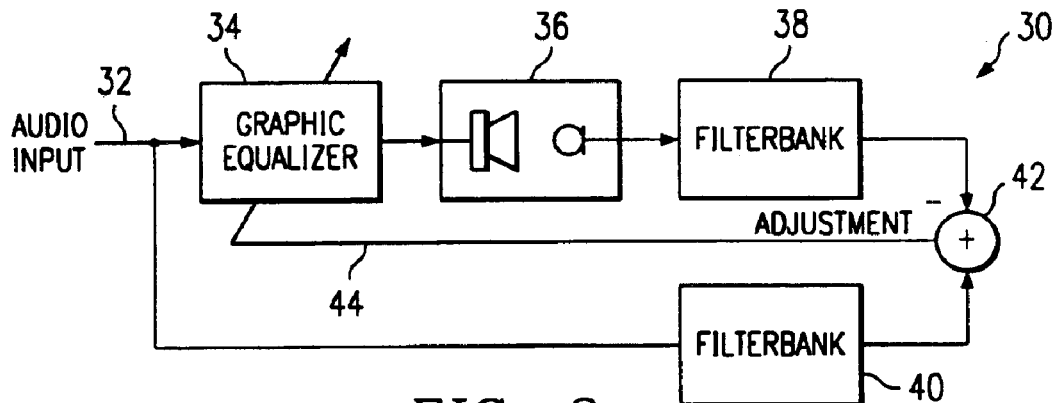
FIG. 2 is a simplified block diagram of an embodiment of a self-adaptive digital graphic equalizer with multiple filters each operating on a sub-band of the audio band constructed according to the teachings of the present invention.
Figure 3A:
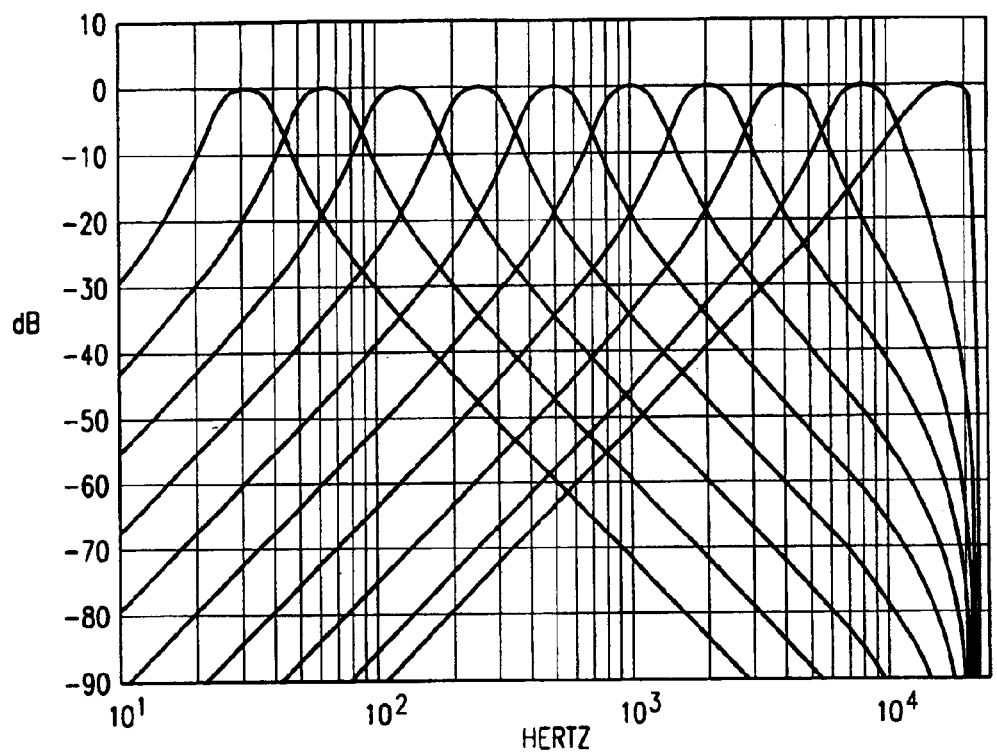
FIGS. 3A and 3B are frequency plots of the filter sub-bands and the graphic equalizer filter family, respectively according to an embodiment of the present invention.
Figure 3B:
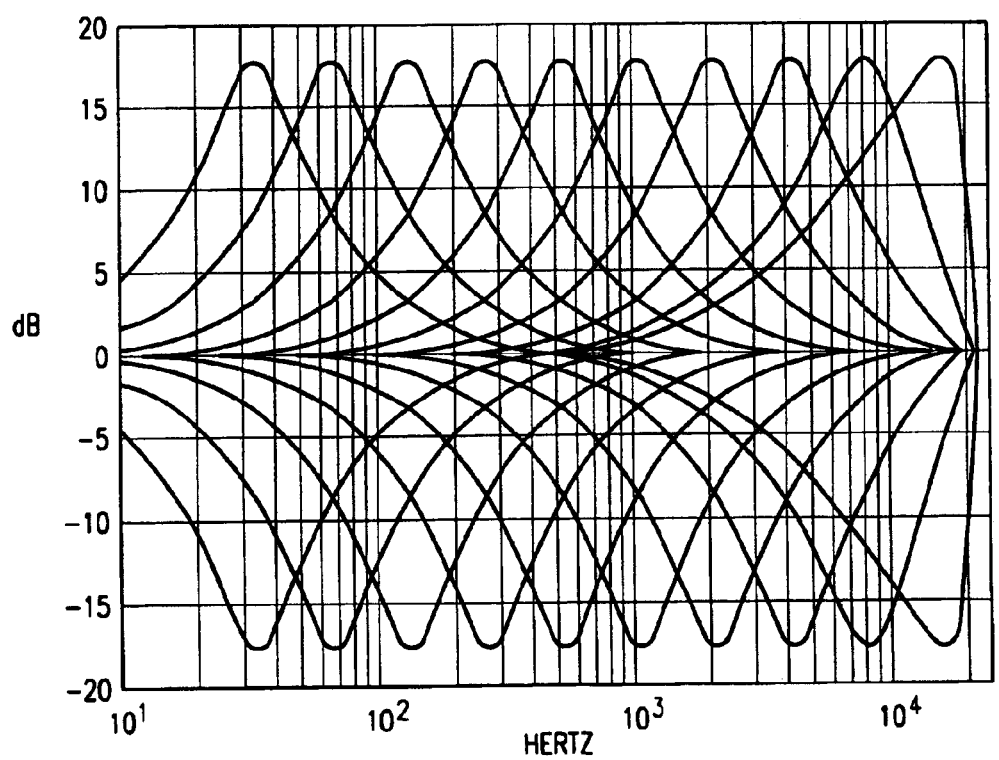

FIG. 2 is a simplified block diagram of an embodiment of a self-adaptive digital graphic equalizer 30 with multiple filters each operating on a sub-band of the audio band constructed according to the teachings of the present invention. Self-adaptive digital graphic equalizer includes an adaptive graphic equalizer 34, which receives an audio input 32 and generates an output supplied to a speaker-microphone combination 36. The system can be pre-calibrated so that the unknown aspects of the performance are all due to the speaker and the play-back environment. For example, if the response of the microphone is not adequately flat, it can be pre-calibrated or equalized. If the microphone is relatively close to the speaker, the measured effects will be mostly due to the speaker itself, while the environment interaction becomes more apparent when the microphone is farther away from the speaker. Speaker-microphone combination block 36 reproduces the audio signal processed by adaptive graphic equalizer 34 and the acoustical sound output is measured by the microphone and provided as an acoustic input to a filterbank 38. The output from filterbank 38 is provided to a summer 42. A second filterbank 40 filters the audio input 32 and also provides output to summer 42. Accordingly, the audio band of interest is divided into a plurality of sub-bands and filtered by filterbanks 38 and 40. Summer 42 determines the difference between the filtered audio input and the filtered acoustic input measured by the microphone and provides an adjustment input 44 to adaptive graphic equalizer 34. Adjustment input 44 is used to adjust adaptive graphic equalizer 34 to remove distortion introduced by the speaker, so that the difference between audio input signal 32 and the output from the speaker is minimized. FIG. 3A contains frequency plots of a 10-band filterbank example, and FIG. 3B is a frequency plot of the graphic equalizer filter family example according to an embodiment of the present invention. For the sake of clarity, FIGS. 3A and 3B provides only the outlines of ±18 dB filters with fixed center frequency/bandwidth value, or Q, and fixed spacing in log-frequency space. It may be noted that the range of the gain, the number of bands, the center frequencies, the spacing between filters, and the bandwidths, can be specified as desired for a particular application. Further, the spacing between the filters in each filter family and the center frequencies of the filter families need not be equidistant. The filter gains can be adjusted to the desired level within the specified range. Self-adaptive graphic equalizer 30 can be used to automatically approximate an inverse function for the speaker in its environment by using the difference between the outputs of the $i^{th}$ filters in filterbanks 38 and 40 to adjust the gain of the $i^{th}$ filter in the graphic equalizer family.

Figure 4:
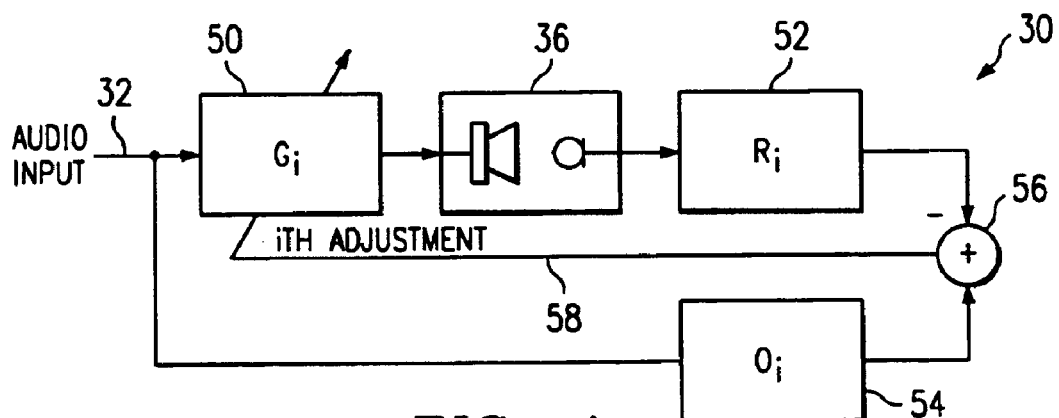
FIG. 4 is a simplified block diagram of an embodiment of the $i^{th}$ band of self-adaptive digital graphic equalizer constructed according to an embodiment of the present invention.

FIG. 4 is a simplified block diagram of an embodiment of the $i^{th}$ band of self-adaptive digital graphic equalizer 30 constructed according to an embodiment of the present invention. Audio input signal 32 is received by an $i^{th}$ band, $G_i$, 50 of graphic equalizer 34 (FIG. 2), which produces an output that is then supplied to the speaker of speaker-microphone combination 36. The microphone measures the acoustic output of the speaker and provided as a measured acoustic input to an $i^{th}$ band, $R_i$, 52 of filterbank 38 applied to the measured or received signal. Audio input 32 is supplied to an $i^{th}$ band, $O_i$, 54 of filterbank 40 applied to the original audio input signal. Typically, $R_i$ and $O_i$ are identical filters. The $i^{th}$ band 50 of adaptive graphic equalizer 34 receives an $i^{th}$ adjustment signal from summer 56, which is the difference between the filtered output of $R_i$ and $O_i$ filters. Therefore, the $i^{th}$ band of graphic equalizer 34 is adjusted according to the difference from summer 56.

Figure 5:
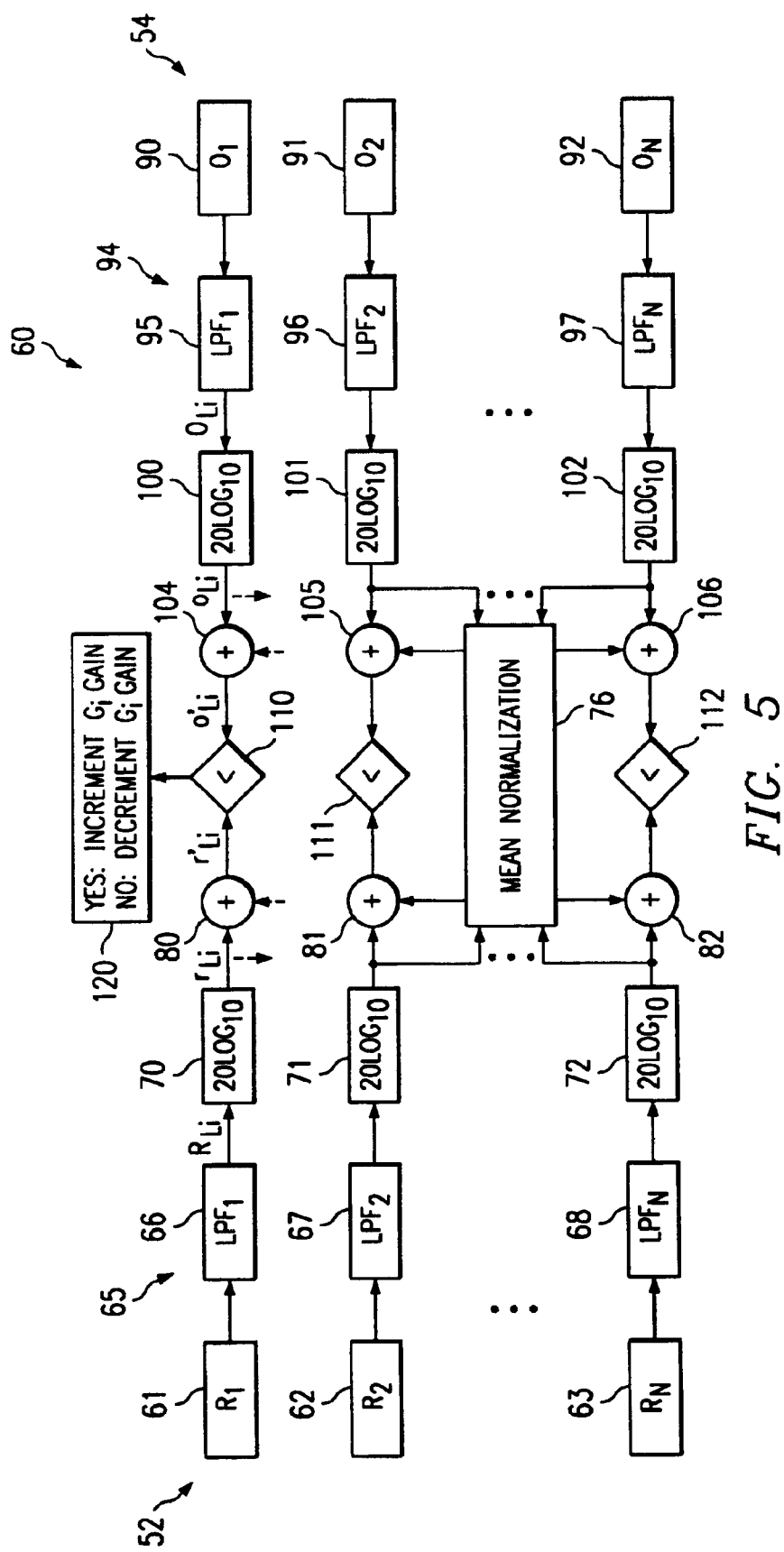
FIG. 5 is a more detailed block diagram of an embodiment of an adaptive circuit and process of the self-adaptive digital graphic equalizer constructed according to an embodiment of the present invention.

FIG. 5 is a more detailed block diagram of an embodiment of an adaptive circuit and process 60 of the self-adaptive digital graphic equalizer constructed according to an embodiment of the present invention. In an embodiment of the present invention, filterbank 52 includes bandpass filters $R_1$ to $R_N$ 61–63, which each filter a sub-band of the measured acoustic output of the speaker. The output from filters $R_{1-N}$ 61–63 are provided to low pass filters 65, $LPF_{1-N}$ 66–68, which time average the $R_{1-N}$ filter outputs. Filterbank 54 includes bandpass filters $O_1$ to $O_N$ 90–92, which each filter a sub-band of the original audio input signal 32. The output from filters $O_{1-N}$ 90–92 are provided to low pass filters 94, $LPF_{1-N}$ 95–97, which time average the $O_{1-N}$ filter outputs. Time averaging the filterbank outputs allows the adaptation to be performed according to general trends rather than on instantaneous measurement values. Further, time averaging compensates for time delay differences between the two paths in the original audio signal and the measured acoustic output. The filtered original audio outputs, $R_{Li}$, are converted to dB space by 20 $\log_{10}$ circuits or algorithm 70–72. The filtered measured acoustic outputs, $O_{Li}$, are converted to dB space by 20 $\log_{10}$ circuits or algorithm 100–102. Accordingly, $$r_{Li} = 20 \log_{10}(R_{Li}), \text{ and}$$

$$o_{Li} = 20 \log_{10}(O_{Li})$$

The dB values, $r_{Li}$ and $o_{Li}$, are provided to a mean normalization circuit or algorithm 76, which normalizes the values to compensate for differences in scaling the two paths. Either $r_{Li}$ or $o_{Li}$ can be manipulated such that $$\Sigma_i r_{Li} \Sigma_i o_{Li}$$

by using summers 80–82 and 104–106. The mean-adjusted $r_{Li}$ and $o_{Li}$ are represented as $r'_{Li}$ or $o'_{Li}$, which are then provided to less than comparison circuit or algorithm 110–112. In one embodiment of the present invention, if $r'_{Li} < o'_{Li}$, then the gain in $G_i$ is incremented by a predetermined amount; if $r'_{Li} < o'_{Li}$ is not true, then the gain in $G_i$ is decremented by a predetermined amount. Alternatively, the adjustment in the gain of the appropriate sub-band of graphic equalizer 50 may be accomplished by using the difference between $r'_{Li}$ and $o'_{Li}$ as the gain in dB which the $i^{th}$ filter in the graphic equalizer is adjusted. As described in U.S. application Ser. No. 09/401422 entitled digital graphic equalizer control system and method, if the gain adjustment is not performed gradually, undesirable audible artifacts results. This embodiment allows for gradual adjustments in the gain to avoid audible artifacts.

Also discussed in digital graphic equalizer control system and method, a frequency of gain update more than every 64 samples of the audio input signal is likely to introduce audible artifacts. Moreover, a listener may be able to discern gain adjustment when it is done too frequently. Therefore, the frequency of gain adjustment should be no more than once per 64 samples, and possibly even slower.

In implementing the present invention, many parameters may be varied and determined based on the specific implementation, such as the number of sub-bands, the orders of the filters, the match between the shapes of the filterbanks and the graphic equalizer filters, center frequencies, maximum ranges, etc. For example, the Q values of the filters may be different and the center frequencies may have spacing other than octave spacing. Therefore, the system designer has the flexibility to tune and adjust the circuit or algorithm according to the application at hand.

Although performance is improved in general when a large number of filters are used, a simplification of using only one bandpass filter. each cycle yields good results. In one embodiment, the audio information is passed through $R_1$ and $O_1$ for a cycle, the filtered audio information is then used to adjust the gain of $G_1$. $R_2$ and $O_2$ would then be applied for the next cycle and the filtered information is then used to update. the gain of $G_2$.

Furthermore, overall convergence of the system is improved when each filter is adjusted individually than when all the filters are adjusted simultaneously. In addition, due in part to the overlapping of the sub-bands, more rapid convergence is achieved when non-adjacent sub-bands are adjusted simultaneously. Therefore in one embodiment, the full sets of bandpass filters in the filterbanks are applied, but the gain correction is only applied to one band each cycle. Further, the adjustment may be done for sub-band i=1 one cycle, i=2 the next cycle, and so forth. Alternatively, the sub-bands are adjusted by cycling through the sub-bands every other or every third subband, for example. If fewer than the total number of sub-bands will be adjusted in any one cycle, it is not necessary to actually implement the bandpass filters whose outputs are not needed. In digital systems, it is a simple matter to change the coefficients as needed, allowing only the particular bandpass filter(s) needed to be implemented.

In one embodiment, ten filter bands are used. The graphic equalizer filters are conventional second order bell-shaped equalizer filters with Q=2. These filters are centered approximately at the frequencies of C's on the piano keyboard with two additional octaves added to cover the entire audio band: 32.7, 65.4, 130.8, 261.6, 523.3, 1046.5, 2093.0, 4186.0, 8372.0, and 16744.0 Hertz. The bandpass filters in both filterbanks may be second order Butterworth filters designed to be centered at the same frequencies as the corresponding graphic equalizer filters. As described. in co-pending application digital graphic equalizer control system and method, rather than changing the equalizing filter coefficients such that the filter gains change in uniform steps on a dB plot, the coefficients may be changed such that the filter gains change in uniform steps on a linear plot. In this manner, when the equalizing filter is at a high gain setting, the gain is changed in very small and gradual increments to avoid generating audible artifacts. As the gain decreases, it becomes possible to change the gain in larger steps and yet still remain artifact free. In other words, by changing the coefficients such that the gain changes linearly, as opposed to logarithmically as in the traditional dB scale, artifacts would be eliminated. For example, 128 filters equally spaced in linear (gain) space between +/−18 dB may be used. In this example, the linear spacing between the filters is approximately 0.0611.

The time-averaging lowpass. filters may also be implemented in a variety of ways, including computing a simple running average. Alternatively, a simple alpha filter $$y(n)=\alpha x(n)+(1-\alpha)y(n-1)$$

with $\alpha=2^{-11}$ may be used, for example.

As discussed in U.S. patent Ser. No. 09/407552, entitled digital Audio Dynamic Range Compressor and Method, the $20 \log_{10}$ operation may be substituted by a base 2 logarithmic operation, which allows simple estimates. Therefore, the conversion to dB space may be performed by or replaced with base 2 logarithm estimates.

In operation, the graphic equalizer filter gains adjust over time and improves the performance of the system. Alternatively, the system may be pre-calibrated by first processing a white noise signal as input, to allow the filters to converge prior to operating on the actual audio signals. Thereafter, the graphic equalizer filter gains can be fixed or allowed to continue to adapt.

According to teachings of the present invention, the division of the audio band into various sub-bands may be extended beyond speaker equalization and be applied to a general inverse filtering problem, where an unknown system alters the audio signal. The present invention may be implemented to pass the altered signal through a filterbank of N filters and adjust the gain of the corresponding sub-band of the graphic equalizer according to a difference between the same sub-band of the filtered input signal. Furthermore, although the present invention is shown and described as being applied to a single channel, a multi-channel system would similarly benefit from the application of the present invention.

Although several embodiments of the present invention and its advantages have been described in detail, it should be understood that mutations, changes, substitutions, transformations, modifications, variations, and alterations can be made therein without departing from the teachings of the present invention; the spirit and scope of the invention being set forth by the appended claims.

What is claimed is:

1. A self-adaptive graphic equalizer operable to equalize the affects of an audio system on an audio signal, comprising:

an adaptive graphic equalizer having a plurality of equalizing filters, the plurality of equalizing filters having different center frequencies and spanning a predetermined audio bandwidth, each equalizing filter being operable to filter an $i^{th}$ sub-band of the audio signal;

a plurality of first filters coupled to the audio system, each first filter being operable to filter a programmed $i^{th}$ sub-band of an output signal of the audio system;

a plurality of second filters receiving the audio signal, each second filter being operable to filter a programmed $i^{th}$ sub-band of the audio signal; and a gain adjuster operable to adjust the $i^{th}$ sub-band of the adaptive graphic equalizer in response to a difference in the $i^{th}$ sub-band of the filtered output signal from the plurality of first filters and the $i^{th}$ subband of the filtered audio signal from the plurality of second filters.

2. The self-adaptive graphic equalizer, as set forth in claim 1, further comprising:

a first plurality of lowpass filters, each lowpass filter being operable to filter an $i^{th}$ sub-band of the filtered audio signal;

a second plurality of lowpass filters, each lowpass filter being operable to filter an $i^{th}$ sub-band of the filtered output signal;

a mean normalization circuit operable to normalize the $i^{th}$ sub-band lowpass filtered audio signals and the $i^{th}$ sub-band lowpass filtered output signal and generate an $i^{th}$ sub-band of mean-normalized audio signal and an $i^{th}$ sub-band of mean-normalized output signals.

3. The self-adaptive graphic equalizer, as set forth in claim 2, further comprising:

a comparator coupled to the mean normalization circuit and operable to determine whether the $i^{th}$ sub-band lowpass filtered output signal is less than the $i^{th}$ sub-band of mean-normalized audio signal; and the gain adjuster of the $i^{th}$ sub-band of the graphic equalizer operable to increment or decrement the gain of the $i^{th}$ sub-band of the graphic equalizer in response to the comparator comparison.

4. The self-adaptive graphic equalizer, as set forth in claim 2, further comprising:

a difference circuit coupled to the mean normalization circuit and operable to determine the difference between the $i^{th}$ sub-band lowpass filtered output signal and the $i^{th}$ sub-band of mean-normalized audio signal; and the gain adjuster of the $i^{th}$ sub-band of the graphic equalizer operable to add or subtract the difference from the gain of the $i^{th}$ sub-band of the graphic equalizer.

5. The self-adaptive graphic equalizer, as set forth in claim 1, wherein the adaptive graphic equalizer comprises ten overlapping sub-bands, each sub-band having filters between ±18 dB.

6. The self-adaptive graphic equalizer, as set forth in claim 1, wherein the plurality of first and second filters each comprises bandpass filters.

7. The self-adaptive graphic equalizer, as set forth in claim 1, wherein the audio system is a speaker-microphone combination system.

8. A digital self-adaptive graphic equalization method to equalize the affects of an audio system on an audio signal, comprising:

receiving an output signal from the audio system, the output signal being generated by the audio system in response to the audio signal;

dividing the output signal into programmed N sub-bands and filtering a programmed $i^{th}$ sub-band of the output signal, where i=1–N;

dividing the audio signal into the same programmed N sub-bands and filtering a programmed $i^{th}$ sub-band of the audio signal, where i=1–N;

determining a difference between the $i^{th}$ filtered sub-band of the audio signal and the $i^{th}$ filtered sub-band of the output signal;

adjusting the gain of an $i^{th}$ equalizing filter of an adaptive graphic equalizer in response the difference between the $i^{th}$ filtered sub-band of the audio and output signals, the equalizing filters having different center frequencies and spanning a predetermined audio bandwidth; and generating an equalized audio signal and providing the equalized audio signal to the audio system.

9. The self-adaptive graphic equalization method, as set forth in claim 8, further comprising:

lowpass filtering an $i^{th}$ sub-band of the filtered audio signal, where i=1–N;

lowpass filtering an $i^{th}$ sub-band of the filtered output signal, where i=1–N;

mean normalizing the $i^{th}$ sub-band lowpass filtered audio signals and the $i^{th}$ sub-band lowpass filtered output signal and generating an $i^{th}$ sub-band of mean-normalized audio signal and an $i^{th}$ sub-band of mean-normalized output signals.

10. The self-adaptive graphic equalization method, as set forth in claim 9, further comprising:

comparing the $i^{th}$ sub-band lowpass filtered output signal with the $i^{th}$ sub-band of mean-normalized audio signal; and adjusting the $i^{th}$ sub-band of the graphic equalizer in response to the comparison.

11. The self-adaptive graphic equalization method, as set forth in claim 9, further comprising:

comparing the $i^{th}$ sub-band lowpass filtered output signal with the $i^{th}$ sub-band of mean-normalized audio signal; and incrementing the $i^{th}$ sub-band of the graphic equalizer in response to the $i^{th}$ sub-band lowpass filtered output signal being less than the $i^{th}$ sub-band of mean-normalized audio signal, or decrementing the $i^{th}$ sub-band of the graphic equalizer in response to the $i^{th}$ sub-band lowpass filtered output signal being greater than the $i^{th}$ sub-band of mean-normalized audio signal.

12. The self-adaptive graphic equalization method, as set forth in claim 9, further comprising:

determining a difference between the $i^{th}$ sub-band lowpass filtered output signal and the $i^{th}$ sub-band of mean-normalized audio signal; and adjusting the $i^{th}$ sub-band of the graphic equalizer by the amount of the determined difference.

13. The self-adaptive graphic equalization method, as set forth in claim 8, wherein filtering the plurality of audio and output signals comprises bandpass filtering the plurality of audio and output signals.

14. The self-adaptive graphic equalization method, as set forth in claim 8, further comprising:

generating sound from the equalized audio signal using a speaker; and measuring the generated sound using a microphone.

15. The digital self-adaptive graphic equalization method, as set forth in claim 8, wherein adjusting the gain of an $i^{th}$ equalizing filter comprises incrementing i from 1 through N.

16. A digital self-adaptive graphic equalization method to equalize the affects of a speaker-microphone system and the environment on an audio signal, comprising:

receiving an output signal from the audio system, the output signal being generated by the audio system in response to the audio signal;

dividing the output signal into N programmed sub-bands and filtering a programmed $i^{th}$ sub-band of the output signal, where i=1–N;

dividing the audio signal into the same N sub-bands and filtering an $i^{th}$ sub-band of the audio signal, where i=1–N;

time averaging the N sub-bands of the filtered output signal;

time averaging the N sub-bands of the filtered audio signal;

normalizing the time averaged N sub-bands of the filtered output signal and the time averaged N sub-bands of the filtered audio signal;

determining a difference between the $i^{th}$ filtered sub-band of the audio signal and the $i^{th}$ filtered sub-band of the output signal;

adjusting the gain of an $i^{th}$ equalizing filter of an adaptive graphic equalizer in response the difference between the $i^{th}$ filtered sub-band of the audio and output signals, the equalizing filters having different center frequencies and spanning a predetermined audio bandwidth; and generating an equalized audio signal and providing the equalized audio signal to the audio system.

17. The self-adaptive graphic equalization method, as set forth in claim 16, wherein time averaging the N sub-bands of the filtered audio signal and the filtered output signal comprises:

lowpass filtering the $i^{th}$ sub-band of the filtered audio signal, where i=1–N; and lowpass filtering the $i^{th}$ sub-band of the filtered output signal, where i=1–N.

18. The self-adaptive graphic equalization method, as set forth in claim 16, wherein adjusting the gain of the graphic equalizing filter comprises incrementing the $i^{th}$ sub-band of the graphic equalizer in response to the $i^{th}$ sub-band lowpass filtered output signal being less than the $i^{th}$ subband of mean-normalized audio signal, or decrementing the $i^{th}$ sub-band of the graphic equalizer in response to the $i^{th}$ sub-band lowpass filtered output signal being greater than the $i^{th}$ sub-band of mean-normalized audio signal.

19. The self-adaptive graphic equalization method, as set forth in claim 16, wherein adjusting the gain of the graphic equalizing filter comprises adjusting the $i^{th}$ subband of the graphic equalizer by the amount of the determined difference.

20. The self-adaptive graphic equalization method, as set forth in claim 16, further comprising:

generating sound from the equalized audio signal using a speaker; and measuring the generating sound using a microphone.

21. A self-adaptive graphic equalizer operable to equalize the affects of an audio system on an audio signal, comprising:

an adaptive graphic equalizer having a plurality of equalizing filters, the plurality of equalizing filters having different center frequencies and spanning a predetermined audio bandwidth, each equalizing filter being operable to filter an $i^{th}$ sub-band of the audio signal;

a plurality of first filters coupled to the audio system, each first filter being operable to filter an $i^{th}$ sub-band of an output signal of the audio system;

a plurality of second filters receiving the audio signal, each second filter being operable to filter an $i^{th}$ sub-band of the audio signal;

a gain adjuster operable to adjust the $i^{th}$ sub-band of the adaptive graphic equalizer in response to a difference in the $i^{th}$ sub-band of the filtered output signal from the plurality of first filters and the $i^{th}$ sub-band of the filtered audio signal from the plurality of second filters;

a time averaging circuit coupled to the plurality of first filters and the plurality of second filters and operable to compute time averages of the plurality of filtered output signals and the plurality of filtered audio signals;

a dB converter coupled to the time averaging circuit operable to convert the time averaged plurality of filtered output signals and the time averaged plurality of filtered audio signals to dB space; and a normalization circuit receiving the time averaged plurality of filtered output signals and the time averaged plurality of filtered audio signals in dB space, and adjusting the signals so that:

$$\Sigma_i r_{Li} = \Sigma_i o_{Li}$$

where $r_{Li}$ is the time averaged $i^{th}$ filtered output signal in dB space, and $o_{Li}$ is the time averaged $i^{th}$ filtered audio signal in dB space.

22. A digital self-adaptive graphic equalization method to equalize the affects of an audio system on an audio signal, comprising:

receiving an output signal from the audio system, the output signal being generated by the audio system in response to the audio signal;

dividing the output signal into N sub-bands and filtering an $i^{th}$ sub-band of the output signal, where i=1–N;

dividing the audio signal into the same N sub-bands and filtering an $i^{th}$ sub-band of the audio signal, where i=1–N;

determining a difference between the $i^{th}$ filtered sub-band of the audio signal and the $i^{th}$ filtered sub-band of the output signal;

adjusting the gain of an $i^{th}$ equalizing filter of an adaptive graphic equalizer in response the difference between the $i^{th}$ filtered sub-band of the audio and output signals, the equalizing filters having different center frequencies and spanning a predetermined audio bandwidth;

generating an equalized audio signal and providing the equalized audio signal to the audio system;

computing a time averages of the plurality of filtered output signals and the plurality of filtered audio signals;

converting the time averaged plurality of filtered output signals and the time averaged plurality of filtered audio signals to dB space; and adjusting the time averaged plurality of filtered output signals and the time averaged plurality of filtered audio signals in dB space so that:

$$\Sigma_i r_{Li} = \Sigma_i o_{Li}$$

where $r_{Li}$ is the time averaged $i^{th}$ filtered output signal in dB space, and $o_{Li}$ is the time averaged $i^{th}$ filtered audio signal in dB space.

* * * * *